United States Patent
Han et al.

(10) Patent No.: US 7,410,909 B2
(45) Date of Patent: Aug. 12, 2008

(54) METHOD OF REMOVING ION IMPLANTED PHOTORESIST

(75) Inventors: Ji Hye Han, Incheon (KR); Ok Min Moon, Gyeonggi-do (KR); Woo Jin Kim, Gyeonggi-do (KR); Hyo Seob Yoon, Gyeonggi-do (KR); Ji Yong Park, Gyeonggi-do (KR); Kee Joon Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 49 days.

(21) Appl. No.: 11/646,700

(22) Filed: Dec. 28, 2006

(65) Prior Publication Data

US 2007/0269990 A1    Nov. 22, 2007

(30) Foreign Application Priority Data

May 18, 2006    (KR) ..................... 10-2006-0044745

(51) Int. Cl.
*H01L 21/461* (2006.01)
*H01L 21/302* (2006.01)

(52) U.S. Cl. .......................... 438/745; 438/746; 134/1; 134/1.3

(58) Field of Classification Search ....................... None
See application file for complete search history.

(56) References Cited

U.S. PATENT DOCUMENTS

| 5,895,272 | A  | * | 4/1999  | Li ............................... 438/705 |
| 6,313,078 | B1 |   | 11/2001 | Tsuboi ......................... 510/175 |
| 6,352,936 | B1 |   | 3/2002  | Jehoul et al. ................. 438/712 |
| 6,372,413 | B2 |   | 4/2002  | Ema et al. .................... 430/326 |
| 6,622,738 | B2 | * | 9/2003  | Scovell .......................... 134/61 |
| 6,683,008 | B1 |   | 1/2004  | Cotte et al. ................... 438/745 |
| 6,875,706 | B2 | * | 4/2005  | Lee et al. ..................... 438/745 |
| 2005/0227482 | A1 | * | 10/2005 | Korzenski et al. ........... 438/639 |

FOREIGN PATENT DOCUMENTS

KR   10-1999-0070021     9/1999

* cited by examiner

*Primary Examiner*—Duy-Vu N Deo
(74) *Attorney, Agent, or Firm*—Marshall, Gerstein & Borun LLP

(57) ABSTRACT

A method of removing an ion implanted photoresist comprises performing first cleaning a semiconductor substrate having the ion implanted photoresist using hot deionized water to which a megasonic process is applied, first rinsing the semiconductor substrate using cold deionized water, drying the semiconductor substrate, removing the ion implanted photoresist, and second cleaning the semiconductor wafer using an SPM solution.

8 Claims, 2 Drawing Sheets

METHOD OF REMOVING ION IMPLANTED PHOTORESIST

BACKGROUND OF THE INVENTION

1. Field of the Invention

The invention relates generally to a method for manufacturing a semiconductor device and, more particularly, to a method of removing an ion-implanted photoresist which is used as an ion-implantation barrier and changed in properties during ion implantation.

2. Related Technology

Currently, a photolithography process is necessarily used in manufacture of semiconductor devices including memory devices. In the manufacture of the semiconductor device, after forming an etching mask layer pattern via exposure and development processes using a photoresist, various patterns are formed on a semiconductor wafer via an etching process using an etching mask layer pattern. Here, the photoresist is used as the etching mask layer pattern to form the patterns on the wafer, and thus is necessarily removed after forming the desired patterns on the wafer via the etching process. Removal of the photoresist is performed by a typical stripping process such as oxygen plasma ashing, and entails a cleaning process to remove a residue of the photoresist.

Meanwhile, the photoresist is often used once more as an ion implantation barrier instead of being removed even after it is used as the etching mask layer pattern. For example, when manufacturing DRAM, the photoresist is used as the etching mask layer pattern to form a bit line contact hole. Then, the photoresist is used as the ion implantation barrier upon implantation of p-type impurities for an improvement in contact resistance of a gate tungsten layer exposed in a peripheral circuit region. In this case, however, the photoresist is also implanted with the impurities, which can change properties of the photoresist. In particular, in the case of implanting boron ions, complexation occurs on the photoresist to cause the photoresist to remain on the wafer even after stripping and cleaning processes are performed to remove the photoresist. If the residue of the photoresist exists, the contact resistance increases in the contact region, deteriorating electric properties of the device, and particles of the photoresist act as a source to lowering reliability of the device.

Conventionally, in order to remove the ion implanted photoresist, an additional cleaning process is performed using a buffered oxide etchant (BOE) cleaning solution or a SC-1 (Standard Clean-1) cleaning solution after performing the cleaning process using a sulfuric acid peroxide mixture (SPM) cleaning solution. When the additional cleaning process is performed using the BOE cleaning solution, however, there is a problem in that the bit-line contact hole opened for the ion implantation is widened due to loss of an oxide layer in spite of a high removal rate of the photoresist. In addition, when the additional cleaning process is performed using the SC-1 cleaning solution, there is a problem in that the ion implanted gate tungsten layer is attacked by the cleaning solution.

SUMMARY OF THE INVENTION

Embodiments of the invention are directed to a method of removing an ion implanted photoresist, which can increase a removal rate of the photoresist changed in properties through ion implantation, thereby preventing deterioration in properties of a device due to residues of the photoresist.

In one embodiment, a method of removing an ion implanted photoresist includes the steps of first cleaning a semiconductor substrate having the ion implanted photoresist using hot deionized water to which a megasonic process is applied; first rinsing the semiconductor substrate using cold deionized water; drying the semiconductor substrate; removing the photoresist; and second cleaning the semiconductor substrate using an SPM solution.

In another embodiment, a method of removing an ion implanted photoresist includes dipping a semiconductor substrate having the ion implanted photoresist into hot deionized water; and cleaning the semiconductor wafer using an SPM solution comprising $H_2SO_4$ and $H_2O_2$ mixed at a ratio of $H_2SO_4:H_2O_2$ in the range of 4:1~50:1.

In another embodiment, a method of removing an ion implanted photoresist includes dissolving the photoresist while cleaning a semiconductor substrate having the ion implanted photoresist formed thereon with a cleaning solution of a mixture of $H_2SO_4$, $H_2O_2$, and HF.

DESCRIPTION OF SPECIFIC EMBODIMENTS

Figure 1:
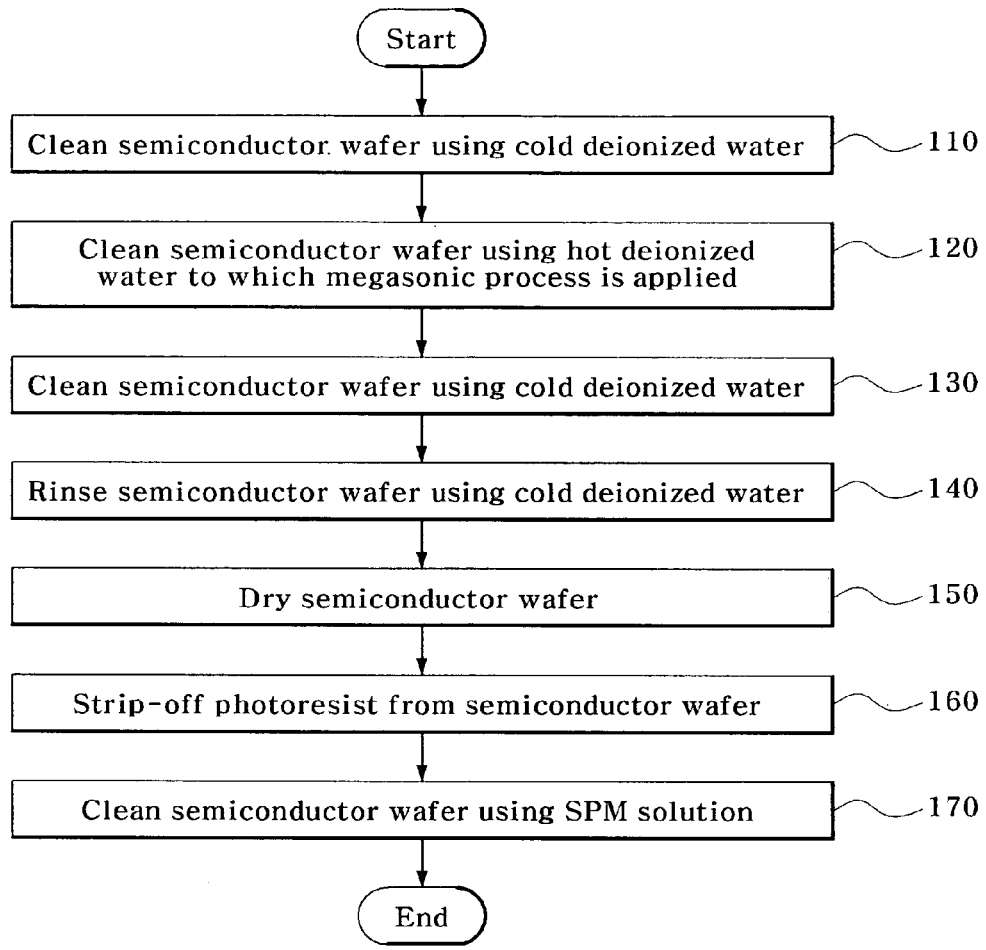
FIG. 1 is a flow chart illustrating a method of removing an ion implanted photoresist according to one embodiment of the invention.

FIG. 1 is a flow chart illustrating a method of removing an ion implanted photoresist according to a first embodiment of the invention. Referring to FIG. 1, after performing ion implantation to a semiconductor substrate using a photoresist as an ion implantation barrier, the substrate having the ion implanted photoresist is loaded on a wet station. In this embodiment, the wet station comprises a chuck cleaner to clean a robot chuck serving to transfer the substrate, a plurality of baths to clean and rinse the substrate using a liquid agent, and a drier to dry the substrate after cleaning and rinsing the substrate. The plural baths comprise liquid agent baths in which the substrate is cleaned by the liquid agent, a hot quick dump rinse bath disposed between the liquid agent baths, an intermediate rinse bath, and a final rinse bath in which the substrate is rinsed.

After being loaded on the wet station having the construction as described above, the substrate is passed through the chuck cleaner and the liquid agent baths. Then, the substrate is cleaned with cold deionized water in the hot quick dump rinse bath (Step 110). The cold deionized water has a temperature of about 25° C., and cleaning of the substrate is performed for about 20 seconds~60 seconds. Then, the substrate is cleaned with hot deionized water of about 90° C.~120° C. by gradually increasing the temperature of the cold deionized water (Step 120). This cleaning operation is performed for about 1 minute~10 minutes. At this time, a megasonic process is applied to the hot deionized water. Impact waves generated through application of the megasonic process activate lifting-off of the photoresist to allow the photoresist to be separated from a lower layer.

Then, the substrate is cleaned with cold deionized water of about 25° C. while gradually decreasing the temperature of the deionized water (Step 130). This cleaning operation is performed for about 20 seconds~60 seconds. As such, the substrate is cleaned using the cold deionized water before and after cleaning with the hot deionized water, so that the semiconductor substrate can be protected from being damaged as much as possible due to abrupt contact with the hot deionized water. Then, the substrate is rinsed by use of cold deionized water in the final rinse bath of the wet station (Step 140). Rinsing of the substrate is performed in such a way of overflowing the cold deionized water in the final rinse bath in which the substrate is located. At this time, the megasonic process is also applied to the cold deionized water, improving a removal rate of the photoresist. Next, the substrate is dried in a drier of the wet station (Step 150).

After a series of processes such as cleaning, rinsing, and drying using the deionized water is completed, the semiconductor substrate is unloaded from the wet station. Then, the photoresist is stripped off from the substrate (Step 160). The stripping of the photoresist can be performed by use of, but is not limited to, oxygen plasma ashing. Although most of the photoresist is removed through the stripping process, there can be a residue of the photoresist on the substrate. Thus, the substrate is loaded again on the wet station, and is subjected a series of processes. At this time, cleaning of the substrate is performed using a cleaning solution of a mixture of $H_2SO_4$, $H_2O_2$, and $H_2O$ (Step 170). Here, since the photoresist has been already lifted off through the cleaning and drying process using the deionized water in Steps 110 to 140, the residue of the photoresist can be satisfactorily removed only by performing the cleaning process with the SPM solution.

Figure 2:
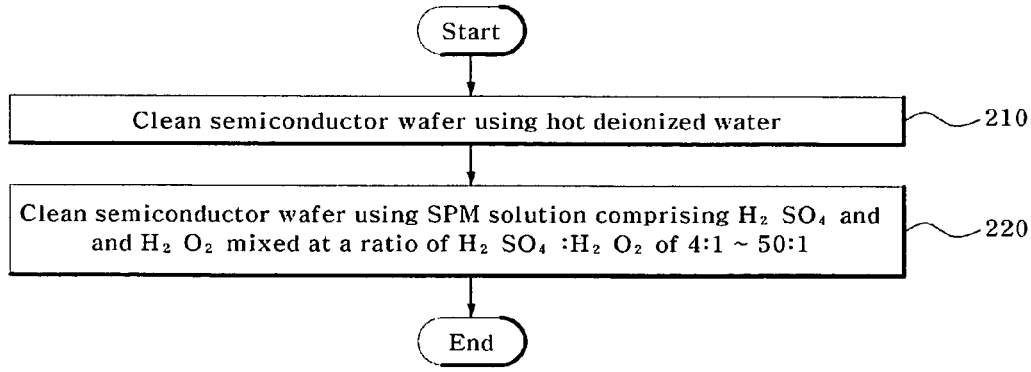
FIG. 2 is a flow chart illustrating a method of removing an ion implanted photoresist according to another embodiment of the invention.

FIG. 2 is a flow chart illustrating a method of removing an ion implanted photoresist according to a second embodiment of the invention. The second embodiment is different from the first embodiment of FIG. 1 in that the ion implanted photoresist is removed through only a cleaning process without performing a separate stripping process of the photoresist.

Referring to FIG. 2, after performing ion implantation to a semiconductor substrate using a photoresist as an ion implantation barrier, the substrate having the ion implanted photoresist is loaded on a wet station. Although it is not necessary to previously perform the stripping process with respect to the photoresist before loading the substrate on the wet station, a typical stripping process such as oxygen plasma ashing can be previously performed. As in the first embodiment, the wet station of the second embodiment also comprises a plurality of baths to clean and rinse the substrate using a liquid agent, and a drier to dry the substrate after cleaning and rinsing the wafer. The plural baths comprise liquid agent baths in which the substrate is cleaned by use of the liquid agent, a hot quick dump rinse bath disposed between the liquid agent baths, an intermediate rinse bath, and a final rinse bath in which the substrate is rinsed.

After being loaded on the wet station having the construction as described above, the substrate is passed through the liquid agent baths. Then, the substrate is cleaned by hot deionized water of about 80° C.~120° C. in the quick dump rinse bath (Step 210). At this time, cleaning of the substrate is performed in such a way of dipping the substrate in the quick dump rinse bath which is filled with the hot deionized water. The cleaning of the substrate is performed for about 10 minutes. With the cleaning of the substrate using the hot deionized water, the photoresist hardened by ion implantation is changed in properties so that a removal rate of the photoresist can be increased by a subsequent cleaning process. Then, the substrate is cleaned using an SPM solution comprising $H_2SO_4$ and $H_2O_2$ mixed at a ratio of $H_2SO_4$:$H_2O_2$, of 4:1~50:1 in the liquid agent bath (Step 220). The cleaning of the semiconductor substrate using the SPM solution is performed for about 5 minutes~15 minutes using the SPM solution at 90° C.~130° C.

Figure 3:
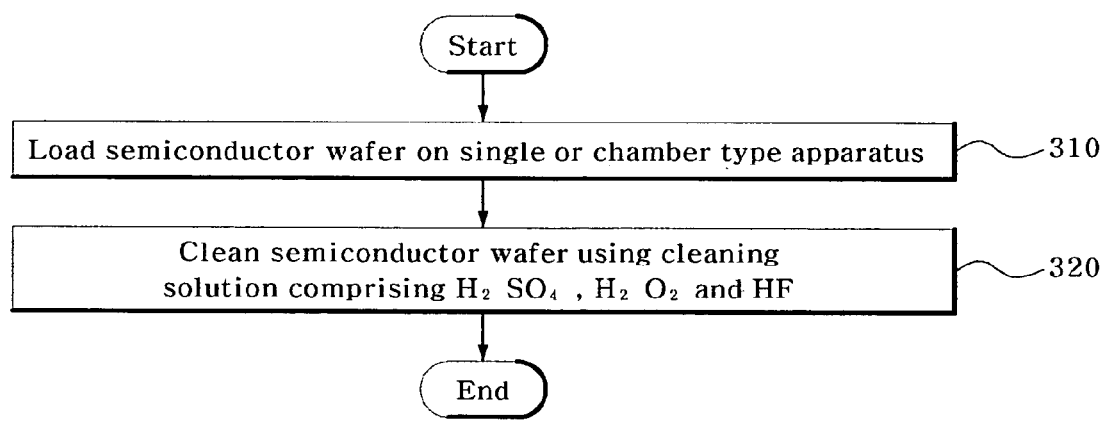
FIG. 3 is a flow chart illustrating a method of removing an ion implanted photoresist according to yet another embodiment of the invention.

FIG. 3 is a flow chart illustrating a method of removing an ion implanted photoresist according to a third embodiment of the invention. The third embodiment is different from the above embodiments in that a specific cleaning solution is used to remove the photoresist through dissolution of the ion implanted photoresist. Referring to FIG. 3, a semiconductor substrate having an ion implanted photoresist is loaded on a single or chamber-type apparatus (Step 310). The apparatus is, but is not limited to, an apparatus which can inject a cleaning solution in the form of spray. Then, the cleaning solution of a mixture of $H_2SO_4$, $H_2O_2$, and HF is supplied into the apparatus to dissolve the ion implanted photoresist (Step 320). In the cleaning solution, $H_2SO_4$ serves to dissolve the photoresist, $H_2O_2$ serves to oxidize the photoresist, and HF serves to slightly etch residues of the photoresist. For this purpose, $H_2SO_4$, $H_2O_2$, and HF are mixed at a weight ratio of $H_2SO_4$:$H_2O_2$:HF of about 100~500:1~5:1~5, the cleaning solution has a temperature of about 100° C.~200° C., and the cleaning is performed for about 1 minute~10 minutes. In some cases, when cleaning the wafer using the cleaning solution of the mixture of $H_2SO_4$, $H_2O_2$, and HF, the substrate may be rotate at about 300 RPM~1,000 RPM.

The embodiments and the accompanying drawings have been described for illustrative purposes only, and the invention is limited only by the following claims. Further, those skilled in the art will appreciate that various modifications, additions and substitutions are allowed without departing from the scope and spirit of the invention as set forth in the accompanying claims.

What is claimed is:

1. A method of removing an ion implanted photoresist, comprising the steps, in order, of:
    first cleaning a semiconductor substrate having an ion implanted photoresist using deionized water to which a megasonic process is applied;
    first rinsing the semiconductor substrate using deionized water;
    drying the semiconductor substrate;
    removing the ion implanted photoresist; and
    cleaning the semiconductor substrate, using a sulfuric acid peroxide mixture (SPM) solution.

2. The method according to claim 1, further comprising:
    cleaning the semiconductor substrate using deionized water before the first cleaning;
    raising the temperature of the deionized water for the first cleaning; and
    second cleaning the semiconductor substrate using deionized water while gradually lowering a temperature of deionized water before the first rinsing.

3. The method of claim 2, comprising performing the cleaning of the semiconductor substrate using deionized water for 20 second-60 seconds before the first cleaning.

4. The method according to claim 2, comprising performing the second cleaning of the semiconductor substrate using the deionized water for 20 seconds-60 seconds after the first cleaning.

5. The method according to claim 1, comprising performing the first cleaning at a temperature of 90° C.-120° C. for 1 minute- to about 10 minutes.

6. The method according to claim 2, comprising performing the first cleaning using the deionized water to which the megasonic process is applied.

7. The method of claim 1, comprising performing the first cleaning using deionized water at a temperature in a range of about 90 degrees Celsius to about 120 degrees Celsius.

8. The method of claim 1, comprising rinsing the semiconductor substrate using deionized water at a temperature of about 25 degrees Celsius.

* * * * *